United States Patent [19]

Maekawa

[11] Patent Number: 5,237,212
[45] Date of Patent: Aug. 17, 1993

[54] LEVEL CONVERTING CIRCUIT

[75] Inventor: Toshikazu Maekawa, Kanagawa, Japan

[73] Assignee: Sony Corporation, Tokyo, Japan

[21] Appl. No.: 819,857

[22] Filed: Jan. 13, 1992

[30] Foreign Application Priority Data

Jan. 16, 1991 [JP] Japan ................................. 3-14906

[51] Int. Cl.⁵ .......................... H03K 5/01; H03K 5/02
[52] U.S. Cl. ..................................... 307/264; 307/567
[58] Field of Search ............... 307/264, 540, 552, 555, 307/567

[56] References Cited

U.S. PATENT DOCUMENTS 4,486,670 12/1984 Chan et al. .......................... 307/264
4,713,600 12/1987 Tsugaru et al. ..................... 307/264

Primary Examiner—John Zazworsky
Attorney, Agent, or Firm—Hill, Steadman & Simpson

[57] ABSTRACT

A level converting circuit for converting input signals into different level signals which enables a stable high speed operation to be realized and which may be used advantageously for driving, above all, liquid crystal display devices. Voltage clamping circuits 1 and 2 are provided at signal input terminals of n-MOS transistors 3 and 4 connected to the drains of pMOS transistors 5 and 6 connected in a current mirror configuration. By these voltage clamping circuits 1 and 2, the input levels of the nMOS transistors 3 and 4 are shifted to higher levels, as a result of which a current larger than that in the conventional circuit flows through the nMOS transistors 3 and 4 to speed up charging and discharging. Stable driving may be enabled even when the nMOS transistors 3 and 4 are formed as thin film field effect transistors for use with liquid crystal display elements.

14 Claims, 5 Drawing Sheets

LEVEL CONVERTING CIRCUIT

BACKGROUND OF THE INVENTION

This invention relates to a level converting circuit for converting input signals into different level output signals, which is particularly suitable for a driving liquid crystal display element.

The level converting circuit is a circuit used for converting input signals into different level output signals, and is used when driving, for example, an active matrix type liquid crystal display element, in which case a power source of 12 to 15 V higher than 5 V of the usual digital circuit is employed and hence it becomes necessary to convert the voltage of 5 V into the higher voltage of 12 to 15 V.

In the prior art, a variety of level converting circuits have been proposed. In JP Utility Model KOKAI Publication No. 8230/1990, there is disclosed a level converting circuit making use of a current mirror circuit. On the other hand, FIG. 6 herein shows a typical conventional level converting circuit. The circuit shown in FIG. 6 is now briefly explained. An output signal VCK of an inverter 61 is supplied to the gate of an nMOS transistor 63, while an output signal VCKX is supplied to the gate of an nMOS transistor 64. The drains of the nMOS transistors 63 and 64 are connected to the drains of pMOS transistors 65 and 66 connected in a current mirror configuration. The drain of the nMOS transistor 64 is connected to the gate of an inverter made up of a pMOS transistor 68 and an nMOS transistor 67. Since a power source voltage $V_{DD}$ is supplied to the inverter and the MOS transistors 63, 64, the output signal of the inverter is converted into a level of 0 to $V_{DD}$. It will be seen from FIG. 7, which is a waveform diagram showing these signals VCK, VCKX, that these signals VCK and VCKX are oppositely phased clock signals.

In operation, when the signal VCK is a high level (H-level) signal and the signal VCKX is a low level (L-level) signal, the nMOS transistor 63 is turned on and the current flowing through the transistor 63 also flows through the pMOS transistor 66 by the current mirror effect. Since the nMOS transistor 64 is turned off, the drain of the nMOS transistor 64 is charged so that the output level of the inverter is at the ground level. If the signals are of reversed polarities, the nMOS transistor 64 is turned on and the nMOS transistor 63 is turned off. The result is that the inverter gate is discharged towards the ground level, while the output level of the inverter is increased towards the $V_{DD}$ level.

In the case of a circuit for driving a liquid crystal device, the nMOS transistors 63 and 64 are constituted by thin-film field effect transistors. Thus the threshold voltage Vth of the nMOS transistors 63 and 64 is of a larger value, resulting in larger process fluctuations. If for example the threshold voltage Vth is increased, the current flowing in the turn-on state is diminished and the charging/discharging rate at a node (inverter gate) is lowered. The result is that the waveform, which should be rectangular, becomes sinusoidal, as shown by a curve PA in FIG. 8, and exhibits blunted rising and falling flanks.

For overcoming such drawback, it may be contemplated to increase the size of the nMOS transistors 63 and 64 significantly. However, in such case, the chip area is increased, or the operating speed can not be increased due to the increased self-capacitance.

OBJECTS AND SUMMARY OF THE INVENTION

In view of the above described status of the art, it is an object of the present invention to provide a level converting circuit which may be operated at a sufficiently high speed despite occasional process fluctuations. It is a more specific object of the present invention to provide a level converting circuit which may be used most advantageously for driving a liquid crystal display element.

For accomplishing the above objects, the present invention provides a level converting circuit in which one ends of first and second elements supplied with oppositely phased signals of a first voltage level are coupled to each other by a current mirror circuit, a power source of a second voltage level is supplied to the current mirror circuit and the first and second elements and in which an output signal of the second voltage level is taken out at a node between the current mirror and the first and second elements, wherein the voltages at the signal input terminals of the first and second elements are clamped by voltage clamping circuits. The input signal terminals of the level converting circuits and the voltage clamping circuits may be coupled to each other by means of capacitive elements. By way of an illustration, the first and the second elements may be formed by thin film transistors and the liquid crystal device may be loaded on the same chip as that on which the level converting circuit is provided.

With the level converting circuit of the present invention, the input signal level is clamped by a voltage clamping circuit, so that the DC level of the input signal is shifted to the clamped level. The result is that the current flowing through the elements at the high level may be enlarged as compared to that when the input signal is not clamped, so that sharp rising and falling edges of the output waveform may be achieved.

In one aspect, the present invention resides in a level converting circuit comprising first signal generating means including a first voltage clamping circuit for outputting a first signal based on a first input signal having a first level, second signal generating means including a second voltage clamping circuit for outputting a second signal based on a second input signal oppositely phased to said first input signal, a first element having at least two terminals one of which is connected to said first voltage clamping circuit, a second element having at least two terminals one of which is connected to said second voltage clamping circuit, a current mirror coupled to the other of said terminals of said first and second elements, a power supply terminal coupled to said current mirror and to said first and second elements, and an output terminal for providing an output signal of a second level different from said first level, said output terminal being connected to a node between said current mirror and said first and second elements.

With the above described voltage clamping circuit of the present invention, the input signals are voltage-clamped by the voltage clamping circuits, so that a higher voltage may be supplied to the first and second elements. The result is that the current flowing through the first and second elements in the turned-on state may be increased to realize a stable operation and sharp rising and falling edges of the output signals. When applied above all to the liquid crystal display devices, the level converting circuit of the present invention is invulnerable against fluctuations otherwise caused due to the production process of the elements to assure stable operation of the liquid crystal display devices.

DESCRIPTION OF THE PREFERRED EMBODIMENT

Figure 1:
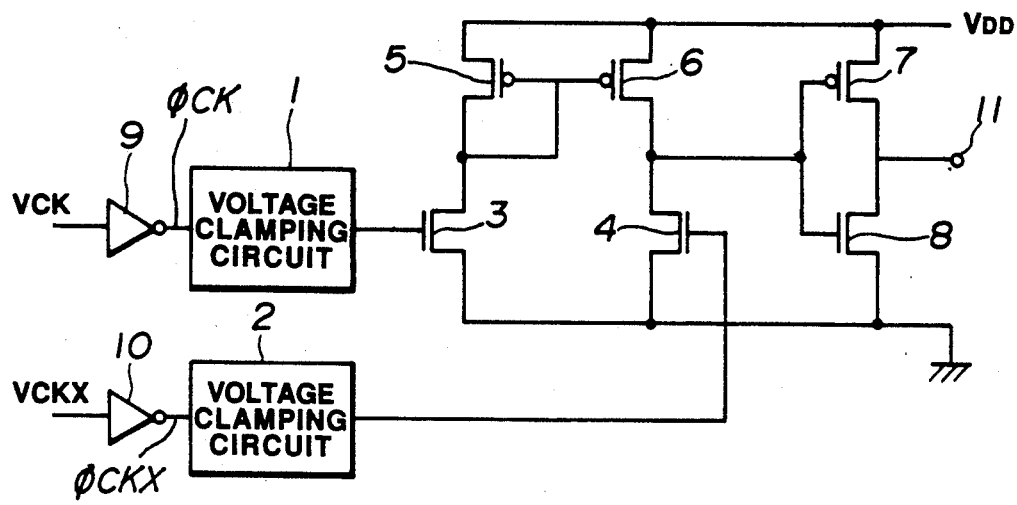
FIG. 1 is a block circuit diagram showing a level converting circuit embodying the present invention.

Referring to the drawings, an illustrative embodiment of the present invention will be explained in detail.

FIG. 1 shows, in a block diagram, a level converting circuit of the present embodiment which is used for driving a liquid crystal display device. Input signals VCK and VCKX are supplied to input terminals of inverters 9 and 10 of an input section, respectively. The input signals VCK and VCKX are oppositely phased clock signals and of a swing amplitude of, for example, approximately 5 V, in accordance with usual digital circuit practice. The output terminals of the inverters 9 and 10 are connected to voltage clamping circuits 1 and 2, respectively. These voltage clamping circuits 1 and 2 are used for shifting the voltage of the input signals VCK, VCKX to the high level side to effect prompt amplification. The output terminals of the voltage clamping circuits 1 and 2 are connected to the gates of an nMOS transistor 3 as a first element and an nMOS transistor 4 as a second element, respectively. In the present embodiment, in particular, the nMOS transistors 3 and 4 are thin film field effect transistors. It is because these transistors may be produced by a parallel process, the level converting circuits are formed on the same glass substrate as that on which the liquid crystal display device to be driven thereby is formed. The ground voltage is supplied to the sources of the nMOS transistor 3 and 4. The drain of the nMOS transistor 3 is connected to the drain of the pMOS transistor 5 and the drain of the nMOS transistor 4 is connected to the drain of the pMOS transistor 6. The pMOS transistors 5 and 6 constitute a current mirror circuit and the common gates of these transistors are connected to the drain of the pMOS transistor 5. A voltage $V_{DD}$ is supplied to the sources of the pMOS transistors 5 and 6. The voltage $V_{DD}$ is of the order of 12 to 15 V, for example, which is a level suitable for driving the liquid crystal display device. A node between the pMOS transistor 6 and the nMOS transistor 5 is connected to the gates of a pMOS transistor 7 and an nMOS transistor 8 together constituting an inverter. The source of the nMOS transistor 8 is grounded and the source of the pMOS transistor 7 is supplied with the voltage $V_{DD}$. The drains of the nMOS transistor 8 and the pMOS transistor 7 are connected to an output terminal 11. It is at this output terminal 11 that the level-converted output signal is produced.

With the above described level converting circuit of the present embodiment, the input signals are shifted towards the high level side by the function of the voltage clamping circuits 1 and 2, so that the gates of the inverter may be driven with a larger current to assure a high speed operation.

Figure 2:
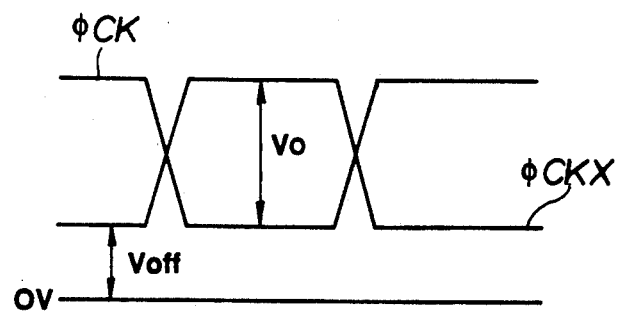
FIG. 2 is a waveform diagram showing voltage-clamped input signals φCK and φCKX to the circuit of FIG. 1.

FIG. 2 is a waveform diagram for illustrating output signals φCK and φCKX of the voltage clamping circuits 1 and 2. The output signals φCK and φCKX of the clamping circuits 1 and 2 are of the same frequency as the input signals VCK and VCKX and of the same swing amplitude between the high and low levels of approximately 5 V as the input signals VCK and VCKX. However, the output voltages φCK and φCKX are level-shifted from the ground level of approximately 0 V by an offset voltage $V_{off}$. Since these level-shifted output signals φCK and φCKX are supplied to the nMOS transistors 3 and 4, the current flowing through the nMOS transistors 3 and 4 is increased to realize a high speed charging and discharging of the inverter gates and hence a high speed operation of the level converting circuits.

Figure 3:
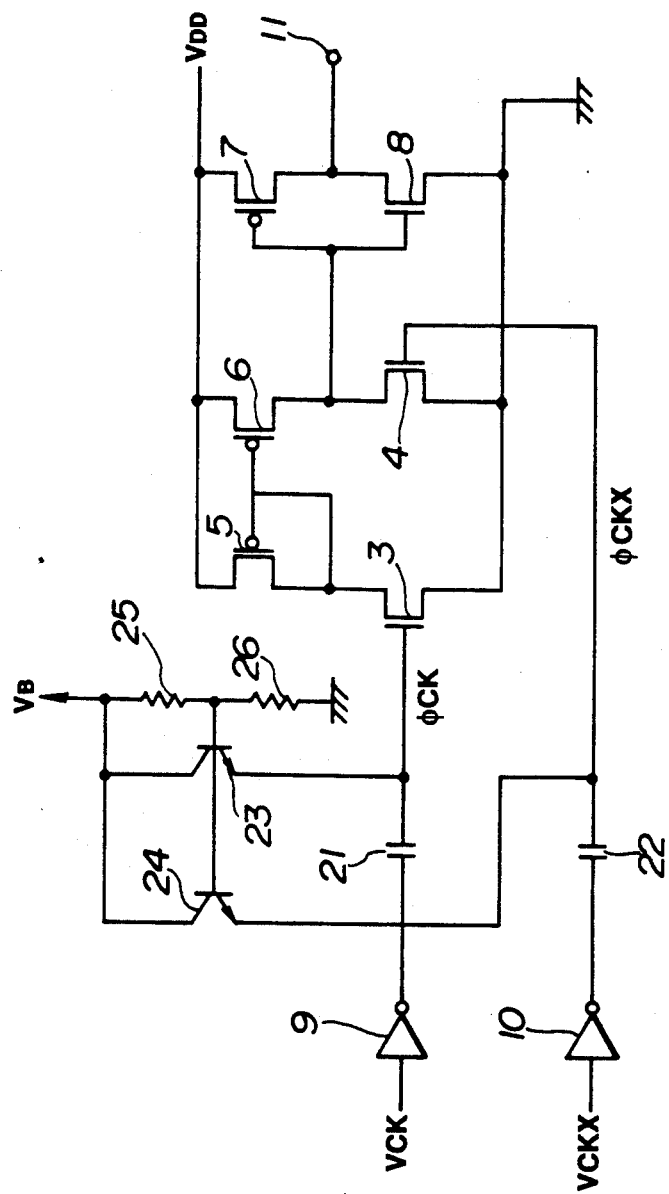
FIG. 3 is a detailed circuit diagram of the circuit shown in FIG. 1.

FIG. 3 shows a specific example of the voltage clamping circuits 1 and 2. The output terminal of the inverter 9 is connected to the gate of the nMOS transistor 3 by means of a capacitance 21 and the output terminal of the inverter 10 is connected to the gate of the nMOS transistor 4 by means of a capacitance 22. The DC level is isolated by such capacitive coupling to enable voltage clamping by the voltage clamping circuits. An npn bipolar transistor 23 has an emitter connected to the terminal of the capacitance 21 connected to the nMOS transistor 3. Similarly, an npn bipolar transistor 24 has an emitter connected to the terminal of the capacitance 22 connected to the nMOS transistor 4. The bases of the npn bipolar transistors 23 and 24 are connected to the node between resistors 25 and 26 while the collectors of the npn bipolar transistors 23 and 24 are connected in common to a voltage $V_B$. The resistors 25 and 26 are connected in series between the voltage $V_B$ and the ground voltage. As a result, a voltage derived from voltage division by the resistors 25 and 26 is supplied to the bases of the npn bipolar transistors 23 and 24. With the above described voltage clamping circuits, with regard to each of the transistors 23 and 24, the DC level of the emitter voltage is set and clamped at a level equal to the base voltage less the threshold voltage.

Meanwhile, the clamped level may be adjusted by adjusting the resistance ratio of the resistors 25 and 26 and the specific value of the voltage $V_B$.

Figure 4:
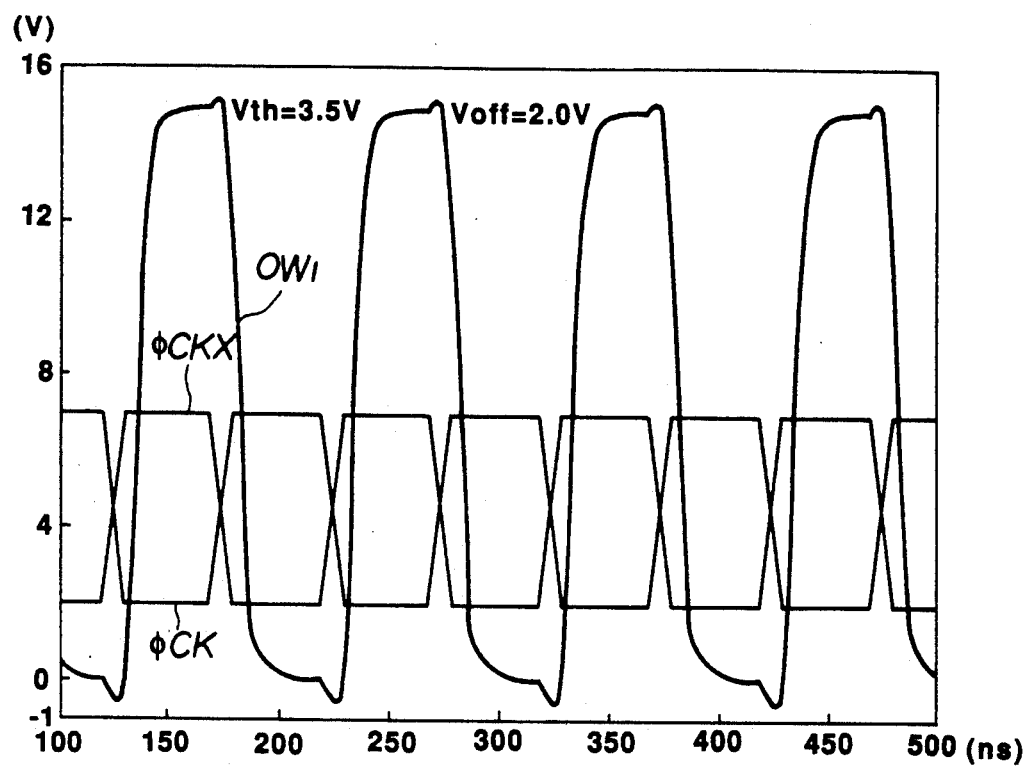
FIG. 4 is a waveform diagram showing simulated output signals for the offset voltage of 2.0 V and the threshold voltage Vth of 3.5 V of the nMOS transistor of the circuit shown in FIG. 1.
Figure 5:
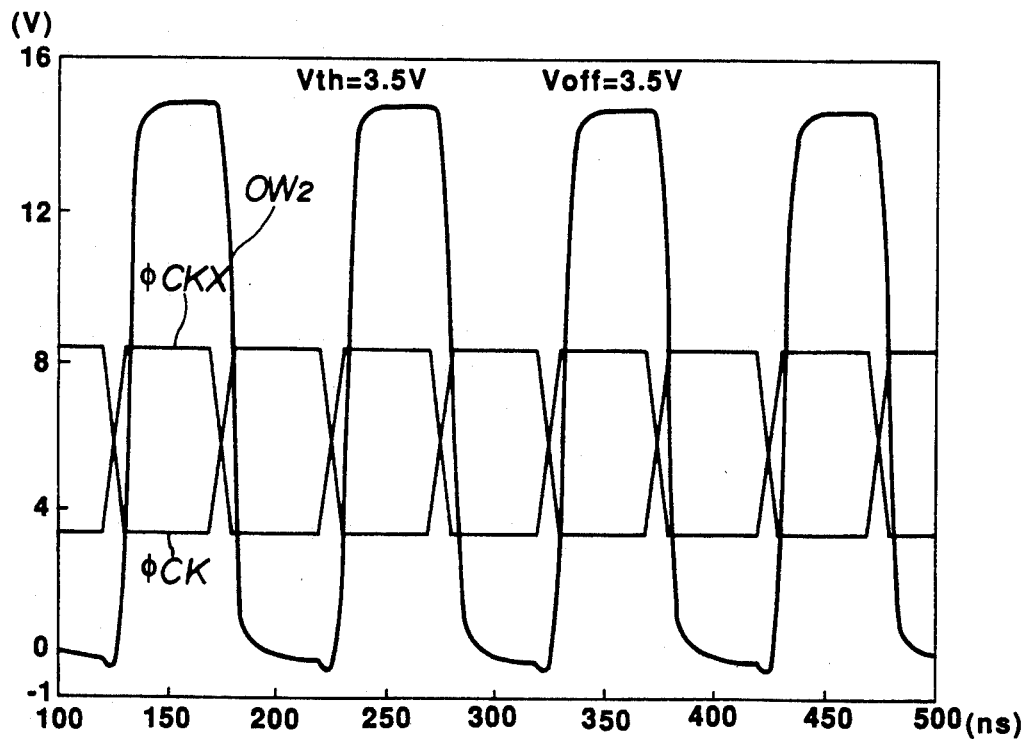
FIG. 5 is a waveform diagram showing simulated output signals for the offset voltage of 3.5 V and the threshold voltage Vth of 3.5 V of the nMOS transistor of the circuit shown in FIG. 1.
Figure 6:
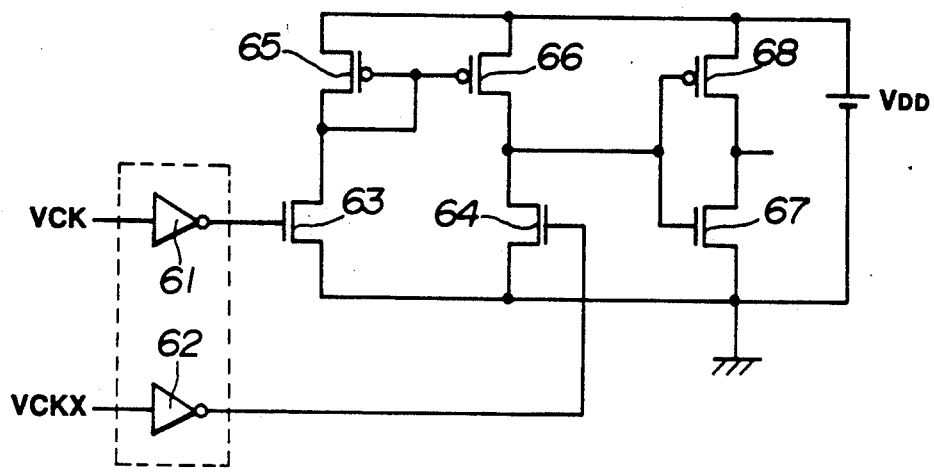
FIG. 6 is a circuit diagram showing a typical conventional level converting circuit.
Figure 7:
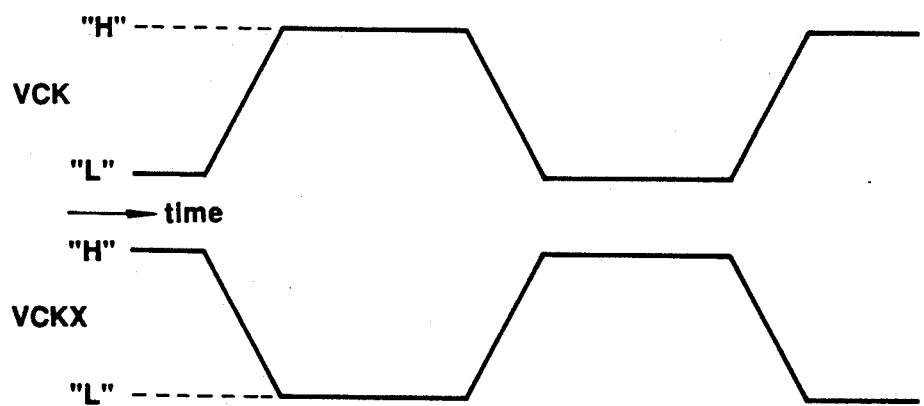
FIG. 7 is a waveform diagram showing input signals VCK, VCKX to the circuit shown in FIG. 6.

FIGS. 4 and 5 show simulated output waveforms to be obtained by using the present level converting circuit. In FIGS. 4 and 5, the threshold voltage Vth of each of the nMOS transistors 3 and 4, which are thin film field effect transistors, is 3.5 V. FIG. 4 shows the waveform for the offset voltage $V_{off}$ of 2 V and FIG. 5 shows that for the offset waveform of 3.5 V.

Figure 8:
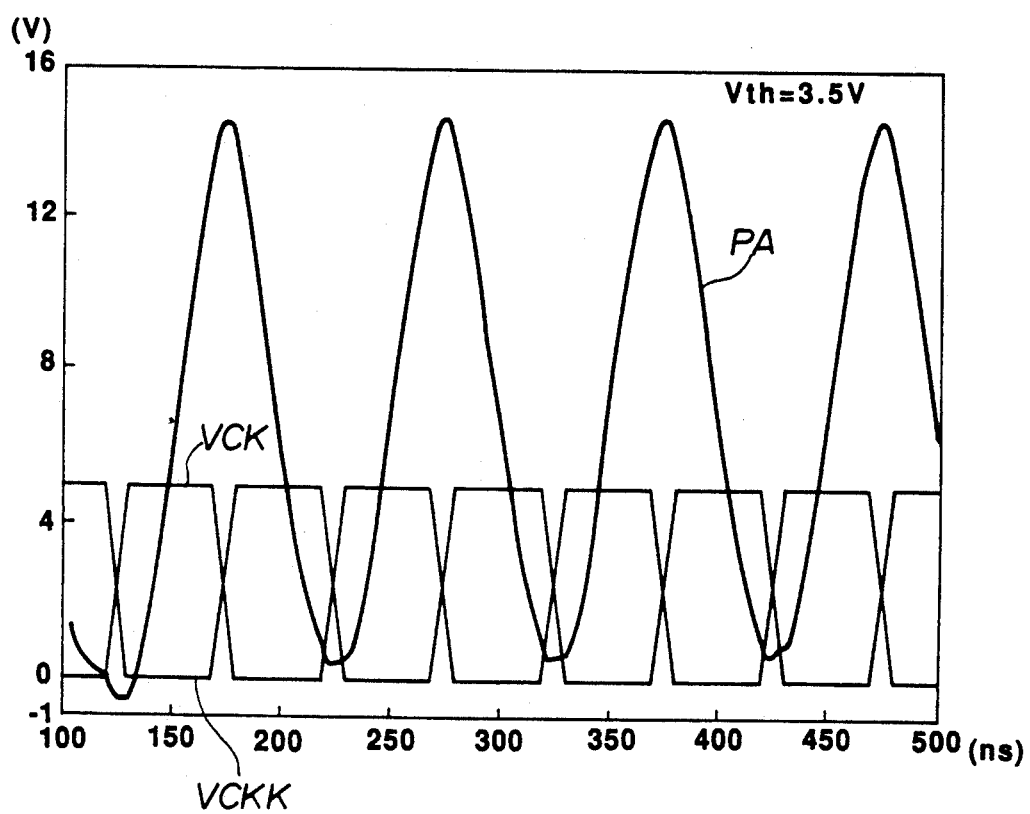
FIG. 8 is a waveform diagram showing simulated output signals for the threshold voltage Vth of 3.5 V of the nMOS transistor of the circuit shown in FIG. 6.

In FIG. 4, the output waveform is shown by a waveform $OW_1$ and, in FIG. 5, the output waveform is shown by a waveform $OW_2$. It is seen from these figures that the output waveforms are less blunt and markedly closer to the rectangular waveform than the output waveform obtained with the conventional circuit shown in FIG. 8. The reason is that the nMOS transistors 3 and 4 are driven by a voltage higher than that in the conventional circuit by the offset voltage $V_{off}$ and hence the source-drain current which will flow when the nMOS transistors 3 and 4 are turned on is increased to effect high-speed charging or discharging of the gates of the inverter.

If applied to a liquid crystal display device, the level converting circuit of the present embodiment may be applied most advantageously to a horizontal shift register type device, because a high operating speed is required of the horizontal shift register in keeping up with the recent tendency towards a higher pixel density such that it needs to be driven at a rate not lower than several megahertz.

What is claimed is:

1. A level converting circuit comprising
   first signal generating means including a first voltage clamping circuit for outputting a first signal based on a first input signal having a first level,
   second signal generating means including a second voltage clamping circuit for outputting a second signal based on a second input signal oppositely phased to said first input signal,
   a first element having at least two terminals one of which is connected to said first voltage clamping circuit,
   a second element having at least two terminals one of which is connected to said second voltage clamping circuit,
   a current mirror coupled to the other of said terminals of said first and second elements,
   a power supply terminal coupled to said current mirror and to said first and second elements, and
   an output terminal for providing an output signal of a second level different from said first level, said output terminal being connected to a node between said current mirror and said first and second elements.

2. A level converting circuit as claimed in claim 1 further comprising a MOS inverter having its input connected to said node and its output connected to said output terminal.

3. A level converting circuit as claimed in claim 1 wherein said first and second elements comprise first and second thin film transistors, respectively.

4. A level converting circuit as claimed in claim 3, wherein said first thin film transistor has a gate connected to an output terminal of said first voltage clamping circuit and wherein said second thin film transistor has a gate connected to an output terminal of said second voltage clamping circuit.

5. A level converting circuit as claimed in claim 1 wherein said current mirror includes a first transistor having a gate and a second transistor having a gate connected to said gate of the first transistor.

6. A level converting circuit as claimed in claim 1 wherein said first signal generating means include a first inverter and said second signal generating means include a second inverter.

7. A level converting circuit as claimed in claim 6 wherein said first element is a first thin film transistor having a gate connected to an output terminal of said first inverter by means of a capacitive element.

8. A level converting circuit as claimed in claim 6 wherein said second element is a second thin film transistor having a gate connected to an output terminal of said second inverter by means of a capacitive element.

9. A level converting circuit as claimed in claim 5 wherein said first and second elements comprise first and second thin film transistors, respectively.

10. A level converting circuit as claimed in claim 9 wherein said first thin film transistor has a drain connected to a drain of the first transistor of the current mirror.

11. A level converting circuit as claimed in claim 9 wherein said second thin film transistor has a drain connected to a drain of the second transistor of the current mirror.

12. A level converting circuit for converting the level of input signals supplied at two input terminals thereof, comprising
    first and second transistors coupled to a power supply terminal by means of a current mirror,
    a voltage clamping circuit for providing first and second signals to be coupled to said first and second transistors, respectively, and
    an output terminal coupled to an output terminal of said first and second transistors for providing an output signal of a level different from the level of said input signals.

13. A level converting circuit as claimed in claim 12 wherein said input terminals are separately connected to said first and second transistors by means of capacitive elements.

14. A level converting circuit as claimed in claim 12 wherein said first and second transistors comprise thin film transistors.

* * * * *